United States Patent [19]
Leahy et al.

[11] Patent Number: 5,359,488
[45] Date of Patent: Oct. 25, 1994

[54] PACKAGING SYSTEM FOR A STANDARD ELECTRONIC MODULE

[75] Inventors: Kevin A. Leahy, Eldersburg; Andrew J. Piloto, Columbia; John G. McKinley, IV, Ellicott City; David B. Harris, Columbia; Timothy M. Fertig, Pasadena; Keith W. Sparks, Columbia, all of Md.

[73] Assignee: Westinghouse Electric Corporation, Pittsburgh, Pa.

[21] Appl. No.: 79,767

[22] Filed: Jun. 21, 1993

[51] Int. Cl.⁵ .............................................. H05K 7/20
[52] U.S. Cl. ..................... 361/707; 257/728; 333/246; 361/761; 361/792
[58] Field of Search .............. 165/80.3, 73, 185; 333/238, 246; 174/252, 260; 257/702, 713, 728; 439/70, 71, 76, 82, 91, 485; 361/688, 689, 702, 704, 705, 707, 711, 719, 722, 736, 744, 761, 764–768, 785, 789, 792, 816; 156/901; 427/96

[56] References Cited
U.S. PATENT DOCUMENTS

| | | | |
|---|---|---|---|
| 4,899,118 | 2/1990 | Poliaski, Sr. | 333/246 |
| 5,023,624 | 6/1991 | Heckman | 333/247 |
| 5,132,648 | 7/1992 | Triah | 361/414 |
| 5,150,088 | 9/1992 | Virga | 333/238 |

Primary Examiner—Gerald P. Tolin

[57] ABSTRACT

A packaging system for a standard electronic module is provided utilizing a multi-layer, low temperature, co-fired ceramic motherboard. Device packages, such as an RF device package, are formed of low temperature, low dielectric, co-fired ceramic materials. The device packages are mounted on a composite heat sink provide on one side of the motherboard. A pressure plate provide on the opposite side of the motherboard is fastened to the heat sink to compress the device package. Pressure contact interconnects are used to make contacts between the device packages and the particular conductor layer in the multilayer motherboard. The radio frequency conductor layer in the motherboard is isolated from power and control layers by ground planes provided in the motherboard.

7 Claims, 2 Drawing Sheets

PACKAGING SYSTEM FOR A STANDARD ELECTRONIC MODULE

BACKGROUND OF THE INVENTION

1. Field Of The Invention

This invention relates to the field of standard electronic modules and, more particularly, to the field of standard electronic modules having RF/microwave packaging therein.

2. Description Of Related Art

The performance and reliability of RF systems, and the ability to accurately predict the reliability of such systems, can be affected by interconnections, substrate mounts, thermal management, and the variety of materials used in the circuits. All of these design parameters can be positively impacted by effective subsystem packaging. The use of circuit size reduction technology provides an efficient implementation of standardized form-fit standard electronic module (SEM) RF modules. However, the use of smaller circuit sizes in an RF module accentuates the reliability of the interconnections, substrate mounts, thermal management, and the variety of materials used in the circuits. Interconnections and connectors provided in the RF module must be made in a smaller volume; substrate mounts in the RF module must support a variety of materials such as silicon, gallium arsenide, ceramics and glass; and thermal management must account for denser heat fluxes and thermal expansion related stresses resulting from the heat generated in the RF module and the different material provided therein.

The performance integrity of the interconnections in the RF module is of particular concern. The physical location, size, position relative to the electrical ground, stability of the ground, and the dielectric properties of the material around the RF signal carrier all affect RF transmission line performance. These factors are extremely critical and vary most at interconnection points. Consequently, the design and integrity of these interconnects is critical to RF performance and reliability. This is particularly true with a dense packaging of monolithic microwave integrated circuit (MMIC) devices where the area available for interconnects is minimal. These interfaces must be carefully controlled in a manner that is standardized so that design and manufacturing costs are minimized.

The substrate and mounting technique used for advanced circuitry is also critical to reliable performance. Ideally, the substrate and mounting techniques do not alter the electrical characteristic of the interconnect. Moreover, the substrate and mounting techniques should not interfere with efficient heat removal from the device, or have a negative impact on the coefficient of thermal expansion induced stress.

SUMMARY OF THE INVENTION

A packaging system for a standard electronic module (SEM) is provided having a low temperature, co-fired ceramic motherboard. The motherboard is provided with a plurality of wells, at least one of which receives a radio frequency device package. The radio frequency device package is formed of a low-temperature, co-fired ceramic dielectric material. The RF device package can be fitted with pressure contact interconnects including spring fingers and button carriers provided between the RF device package and other device packages and a pressure plate or through more conventional interconnect methods such as wirebonding, ribbon welding or lead soldering. The ceramic motherboard is provided with a stripline RF center conductor surrounded by an upper and lower ground plane. The upper and lower ground plane serve to control the characteristic impedance and isolate the RF signal transmitted in the center conductor from other signals. This allows controlled signal transmission and prevents the introduction of undesired signals from interfering with the RF signal.

In fabricating the SEM, the RF device package, as well as other elements such as a digital package or unique packages such as diodes, is mounted directly to a heat sink over which the motherboard, to which such packages are electrically interconnected, fits. This is the reverse of current methods of mounting devices to boards. The device packages are individually located and mounted to the composite heat sink using a thermally conductive adhesive or other non-adhesive thermally conductive interface. Such an interface minimizes mechanical strain generated during assembly and enhances the thermal efficiency of the interface, thereby reducing environmental temperature excursions.

DETAILED DESCRIPTION OF THE PREFERRED EMBODIMENTS

Figure 1:
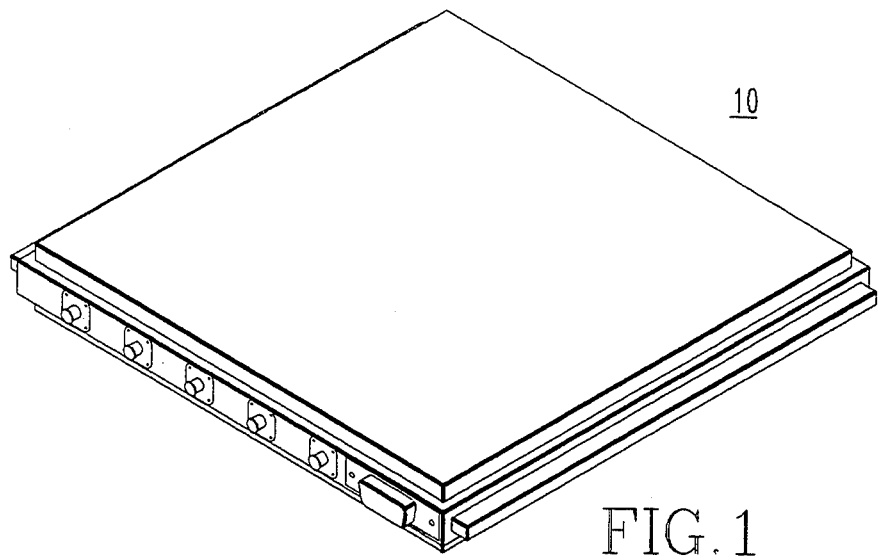
FIG. 1 is an isometric view of a presently preferred embodiment of the standard electronic module device of the present invention.
Figure 2:
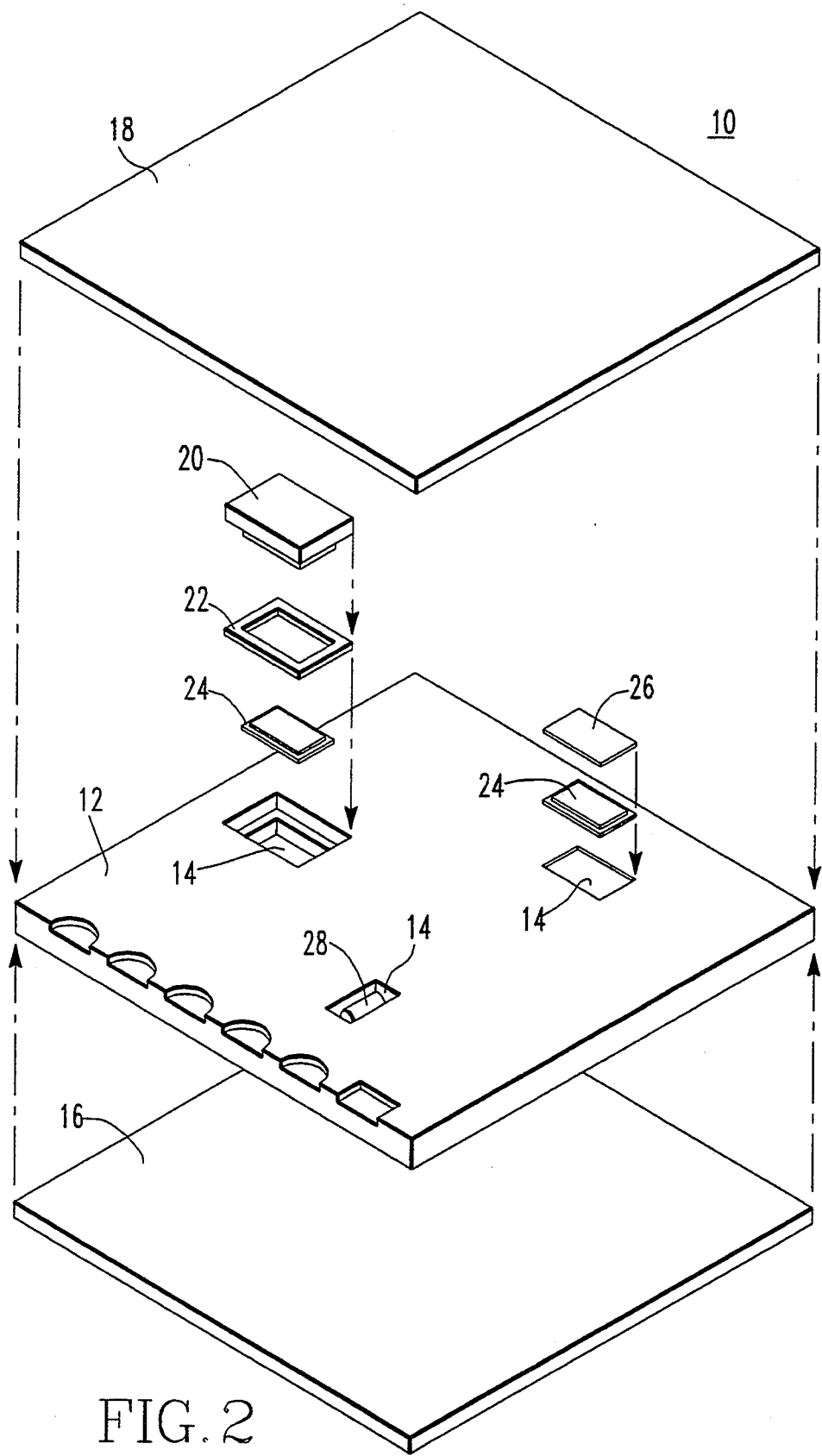
FIG. 2 is an exploded isometric view of one half of the standard electronic module of FIG. 1.

Through the combination of low temperature, co-fired ceramic motherboards, low temperature and high temperature packages and conventional device packages, solder free interconnections, and composite heat sinks, a significant improvement in standard electronic module (SEM) reliability can be achieved. This improvement is a result of more efficient heat removal from the devices and elimination of failure mechanisms through a reduction in interconnects and components and the improvement in coefficient of thermal expansion mismatch between materials. The component reduction is a result of both a high level of MMIC insertion and the ability to integrate RF and digital components and passive circuits in the co-fired ceramic motherboard and packages. The result is a reduction in the number of interconnects and parts. FIGS. 1 and 2 provide isometric views of a SEM-E package. As shown in FIG. 2, SEM 10 includes a motherboard 12 having a plurality of wells 14 provided therein. Wells 14 are adapted in shape and size to receive various device packages. Pressure plate 16 is provided on the base of the motherboard 12. A composite heat sink 18, such as formed of P-100 composite, is provided over top motherboard 12. Pressure plate 16 is fastened to heat sink 18 to secure the SEM package 10.

Motherboard 12 is adapted to receive various device packages within wells 14. One such device is an RF device package 20. In accordance with this invention, RF device package 20 is especially constructed to utilize solder free interconnects. Optional solder free interconnect carrier 22 provides an RF interconnect for the RF device package 20. Solder free interconnect 24 provides a power and control interconnect for the RF device package 20. Motherboard 12 is also able to receive other device packages such as digital package 26 which is also provided with solder free interconnect carrier 24 for a power and control interconnect. Moreover, motherboard 12 can be adapted to receive other unique packages such as glass diode 28. SEM 10 allows the use of digital device package 26 and unique packages such as glass diodes 28 without necessitating a new package design for these devices.

Figure 3:
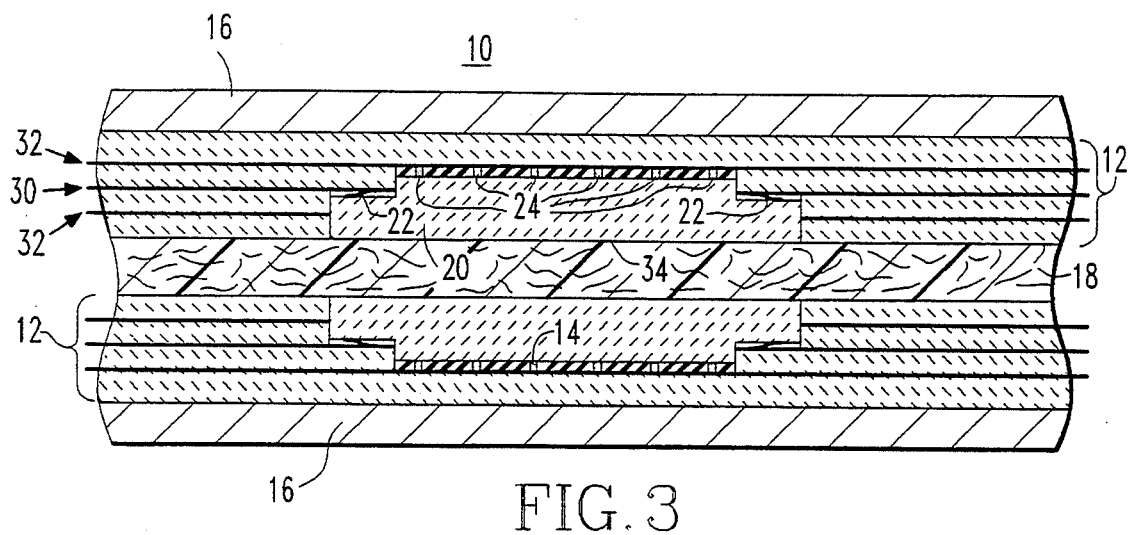
FIG. 3 is a cross-sectional view of an alternative embodiment of the standard electronic module device of the present invention isolating on the RF device package.

FIG. 3 shows an alternative embodiment of the SEM package in which two motherboards 12 are provided on opposing side of composite heat sink 18. Pressure plates 16 are provided on the outside of each motherboard to form a final package. As shown in FIG. 3, motherboard 12 is a multi-layer board incorporating both microwave and conventional signal transmission media. As shown in FIG. 3, motherboard 12 includes a center conductor 30 which is an RF conductor connected to the optional solderless interconnect carrier 22 in contact with RF device package 20. Ground planes 32 are provided on either side of RF center conductor 30. The ground planes 32 isolate the RF signal path from other signals such as digital, power, ground, and control signals. This insures that energy generated by these other conventional signals is not introduced to the RF signal and vice versa. Aside from the provision of a second motherboard, SEM 10 in FIG. 3 is identical to SEM 10 in FIG. 10, including the makeup of motherboard 12.

As can be seen in FIG. 3, the shape of RF device package 20 conforms to the contours of the well 14 made for device 20 in motherboard 12. This insures that the characteristic impedance of the interconnect is controlled by allowing the dielectric constant of the media surrounding the interconnection to remain uniform and the interconnections remain in plane. The dielectric constant is maintained by constructing the device package 20 out of low temperature, co-fired ceramic material, the same material as in motherboard 12. By controlling these parameters around the interconnection to the device 20, performance is insured for a standard interconnect technique.

In the embodiment of both FIGS. 1 and 2 and the embodiment of FIG. 3, the device packages are mounted directly to composite heat sink 18 and the motherboard 12, to which the devices are electrically interconnected, fits over the devices. This is the reverse of the current method of mounting devices to boards. The device packages are individually located and mounted to composite heat sink 18 using a thermally conductive adhesive 34 or other non-adhesive thermally conductive material. A flexible adhesive 34 is required to minimize mechanical strain generated during assembly and environmental temperature excursions.

As previously discussed, the interconnects used in SEM 10 are solderless interconnects or conventional interconnects. Solderless interconnections are used for essentially two reasons. First, the interconnects in SEM are hidden because of the manner in which the devices fit into motherboard 12. Therefore, pressure contact interconnects provide the most efficient means of accessing the device packages. Second, although tolerances can be held very tightly with low temperature co-fired ceramic materials, pressure contact interconnects account for any variations in contact height and package-to-package height variations. This ensures the continuous contact at the interconnects.

Two types of PCI contacts can be used for the interconnections in SEM 10. Spring finger carrier interconnects such as shown at 22 can be used. The spring finger carrier interconnects are formed from a thin sheet of beryllium copper and plated with nickel and gold. Spring finger carrier interconnects 22 complete the RF strip line interconnections in SEM 10. Digital, power, ground, and control signal interconnections are made on the top of the package with fuzz button carrier interconnects 24. The fuzz buttons 24 are formed from a randomly woven column of gold-plated beryllium copper or molybdenum wire. Fuzz buttons 24 are held in a carrier in a pattern that matches the input/output configuration of the device.

The load required to compress the two sets of pressure contact interconnects is generated by pressure plate 16 being mounted over motherboard 12 and fastened to composite heat sink 18. When pressure plate 16 is fastened to composite heat sink 18, the interconnections are compressed and the appropriate contacts between each device package and its respective signal path are made.

SEM 10 provides a standard packaging and interconnect system for MMIC devices and other advanced, high integrated, small RF devices. The design promises to provide increased reliability while maintaining the performance required for RF systems. By using a composite heat sink 18, SEM 10 reduces weight, minimizes thermal expansion mismatch problems, and improves thermal transfer capability. By using pressure contact interconnects, SEM 10 provides compliant interconnects. Finally, by using low temperature co-fired ceramic packages and boards, SEM 10 improves packaging density and reduces the number of interconnects. In one study of the present design, a log video amplifier assembly was constructed using the low temperature co-fired ceramic material in the new design and compared with the older design. In addition to dramatically increasing the packaging density of the log video amplifier, the present invention increased the reliability of the log video amplifier by a factor of 175.

In the foregoing specification certain preferred practices and embodiments of this invention have been set out, however, it will be understood that the invention may be otherwise embodied within the scope of the following claims.

We claim:

1. A packaging system for a standard electronic module comprising:

a. a low temperature, co-fired ceramic motherboard, said motherboard provided with a plurality of wells, said motherboard having multiple layers provided therein, at least one of said layers containing a radio frequency conductor, said radio frequency conductor being isolated from other layers by ground planes;

b. a radio frequency device package, said radio frequency device package fitting into one of said plurality of wells provided in said motherboard, said radio frequency device package being formed of a low temperature co-fired ceramic dielectric material;

c. at least one pressure contact interconnect in contact with said radio frequency device package which connects said radio frequency device package to a conductor provided in said motherboard;

d. a composite heat sink provided along a first face of said motherboard, said radio frequency device package being mounted on said composite heat sink; and e. at least one pressure plate provided along a second face of said motherboard opposite said heat sink, said pressure plate being fastened to said heat sink to compress the standard electronic module and to force said at least one pressure contact interconnect into contact position.

2. The packaging system of claim 1 wherein said at least one pressure contact interconnect is a spring finger, said spring finger connecting said radio frequency device package to said radio frequency conductor provided in said motherboard.

3. The packaging system of claim 2 further comprising a second pressure contact interconnect, said second pressure contact interconnect contacting said radio frequency device package and connecting said radio frequency device package to at least one of a power and control conductor and a radio frequency conductor provided in said motherboard.

4. The packaging system of claim 3 wherein said second pressure contact interconnect is a button carrier.

5. The packaging system of claim 1 further comprising at least one additional device package mounted on said composite heat sink, each at least one additional device package fitting into one of said wells on said motherboard.

6. The packaging system of claim 5 wherein one said at least one additional device package is a digital package device.

7. The packaging system of claim 5 wherein one said at least one additional device package is a glass diode.

* * * * *